US009252304B2

(12) United States Patent
Todorov

(10) Patent No.: US 9,252,304 B2
(45) Date of Patent: Feb. 2, 2016

(54) SOLUTION PROCESSING OF KESTERITE SEMICONDUCTORS

(71) Applicant: International Business Machines Corporation, Armonk, NY (US)

(72) Inventor: Teodor K. Todorov, Westchester, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/644,672

(22) Filed: Oct. 4, 2012

(65) Prior Publication Data
US 2014/0096826 A1    Apr. 10, 2014

(51) Int. Cl.
*H01L 31/032* (2006.01)
*C08K 3/02* (2006.01)
*C08K 3/28* (2006.01)
*C08K 5/098* (2006.01)
*H01L 31/0224* (2006.01)

(52) U.S. Cl.
CPC .............. *H01L 31/0326* (2013.01); *C08K 3/02* (2013.01); *C08K 3/28* (2013.01); *C08K 5/098* (2013.01); *H01L 31/022466* (2013.01); *Y02E 10/50* (2013.01)

(58) Field of Classification Search
CPC .................................................... H01L 31/0326
USPC ...................................... 427/74, 76; 136/264
See application file for complete search history.

(56) References Cited

U.S. PATENT DOCUMENTS

| 2003/0041894 A1 | 3/2003 | Sverdrup, Jr. et al. |
| 2004/0089338 A1 | 5/2004 | Kukulka |
| 2009/0266416 A1 | 10/2009 | Tolbert et al. |
| 2011/0094557 A1* | 4/2011 | Mitzi et al. ............ 136/244 |
| 2012/0060928 A1* | 3/2012 | Johnson et al. .......... 136/264 |

FOREIGN PATENT DOCUMENTS

| WO | 2011051012 A1 | 5/2011 |
| WO | WO2011051012 A1 | 5/2011 |

OTHER PUBLICATIONS

Cu2ZnSnS4 films deposited by a soft-chemistry method, Todorov et al, Thin Solid Films 517 (2009), pp. 2541-2544.*
Ravindranathan, P., "Thermal Reactivity of Metal Formate Hydrazinates", Thermochimica Acta, Received Jun. 6, 1983; vol. 71, Issues1-2; pp. 53-57 (Abstract).

(Continued)

*Primary Examiner* — Alex A Rolland
(74) *Attorney, Agent, or Firm* — Cantor Colburn LLP; Vazken Alexanian

(57) ABSTRACT

Methods for depositing a kesterite film comprising a compound of the formula:

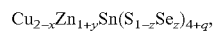

$Cu_{2-x}Zn_{1+y}Sn(S_{1-z}Se_z)_{4+q}$, wherein $0 \leq x \leq 1$; $0 \leq y \leq 1$; $0 \leq z \leq 1$; $-1 \leq q \leq 1$, generally include contacting a hydrazine-based solvent, a source of Cu, a source of Sn, a source of Zn carboxylate, a source of at least one of S and Se, under conditions sufficient to form a solution substantially free of solid particles; applying the solution onto a substrate to form a thin layer; and annealing the thin layer at a temperature, pressure, and length of time sufficient to form the kesterite film. Also disclosed are hydrazine-based precursor solutions for forming a kesterite film and a photovoltaic device including the kesterite film formed by the above method.

14 Claims, 3 Drawing Sheets

(56) References Cited

OTHER PUBLICATIONS

Ki, Wooseok., et al. "Earth-Abundant Element Photovoltaics Directly from Soluble Precursors with High Yield Using a Non-Toxic Solvent", Advanced Energy Materials, Received Mar. 16, 2011, pp. 732-735.

Todorov, Teodor K., et al. "High-Efficiency Solar Cell with Earth-Abundant Liquid-Processed Absorber", Advanced Energy Materials, Received Dec. 4, 2009, pp. E156-E159.

Todorov, Teodor K., et al. "Cu2ZnSnS4 Films Deposited by a Soft-Chemisty Method", Thin Solid Films, Published Online Nov. 8, 2008; vol. 517, pp. 2541-2544.

Yang, Wenbing,. et al. "Novel Solution Processing of High-Efficiency Earth-Abundant Cu2AnSn (S,Se)4 Solar Cells", Advanced Materials, Received May 3, 2012, pp. 1-7.

Yang, Haoran,. et al. "Nontoxic and Abundant Copper Zinc Tin Sulfide Nanocrystals for Potential High-Temperature Thermoelectric Energy Havesting", American Chemical Society, Received May 20, 2011; vol. 12, pp. 1-7.

\* cited by examiner

SOLUTION PROCESSING OF KESTERITE SEMICONDUCTORS

BACKGROUND OF THE INVENTION

The present disclosure relates to a method of depositing a kesterite film. More particularly, the present disclosure relates to a method of depositing a kesterite film from a precursor solution.

Large-scale production of photovoltaic devices requires high-throughput technologies and abundant environmentally friendly materials. Thin-film chalcogenide-based solar cells provide a promising pathway to cost parity between photovoltaic and conventional energy sources.

Currently, only $Cu(In,Ga)(S,Se)_2$ and CdTe technologies have reached commercial production and offer over 10 percent power conversion efficiency. These technologies generally employ (i) indium and tellurium, which are relatively rare elements in the earth's crust, or (ii) cadmium, which is a highly toxic heavy metal.

Copper-zinc-tin-chalcogenide kesterites have been investigated as potential alternatives because they are based on readily available and lower cost elements. However, photovoltaic cells with kesterites, even when produced using high cost vacuum-based methods, at best only <6.7 percent efficiencies, see Katagiri, H. et al. Development of CZTS-based thin film solar cells; Thin Solid Films 517, 2455-2460 (2009).

The commonly owned applications: U.S. Pub. App. No. 2011/0094557A1, and PCT App. No. WO 2011/051012 to Todorov et al. and a publication by T. Todorov, K. Reuter, D. B. Mitzi, Advanced Materials, (2010) Vol. 22, pages 1-4, generally describe a hydrazine-based deposition approach of depositing homogeneous chalcogenide layers from mixed slurries containing both dissolved and solid metal chalcogenide species dispersions of metal chalcogenides in systems that do not require organic binders. Upon anneal the particle-based precursors readily react with the solution component and form large-grained films with good electrical characteristics. Recently, this process achieved world-record efficiency for this class of materials of 11.1% (T. Todorov, J. Tang, S. Bag, O. Gunawan, T. Gokmen, Y. Zhu, D. B. Mitzi, "Beyond 11% Efficiency: Characteristics of State-of-the-Art Cu2ZnSn(S,Se)4 Solar Cells", Advanced Energy Materials, early view: DOI: 10.1002/aenm.201200348).

A major challenge in hydrazine-based copper-zinc-tin-chalcogenide kesterite processing including copper-zinc-tin-sulfide (CZTS), copper-zinc-tin-selenide (CZTSe), and copper-tin-zinc-sulfur-selenium (CZTSSe), is the poor solubility of the zinc chalcogenide-hydrazinates that generally form a solid phase in the ink. Unlike the various soluble chalcogenides compounds, zinc compounds such as ZnS and ZnSe, together with most transition metals and metal chalcogenides, show negligible solubility in hydrazine-based solvent systems. The morphology and dispersibility of the solid phase of these zinc compounds are difficult to control resulting in poor reproducibility of the hydrazine-based copper-zinc-tin-chalcogenide kesterite slurries that may cause microscale compositional non-uniformities, thereby potentially deteriorating device performance. Furthermore, particle-based inks may have poor compatibility with liquid-coating equipment such as slit-casting and spin coating due to non-Newtonian liquid properties of these slurries.

A pure solution precursor ink formulation for copper-zinc-tin-chalcogenide kesterite based on DMSO solutions was previously reported (W. Ki, H. Hillhouse Adv. Energy Mater. 2011, 1, 732-735). However, maximum efficiency reached only 4.1% possibly due to difficult to eliminate impurities introduced with the selected precursors. Another example employing sol-gel solutions in methoxyethanol reports 2.2% efficiency.

SUMMARY OF THE INVENTION

Accordingly, the present disclosure discloses various methods for depositing a kesterite film; a hydrazine-based precursor solution for forming the kesterite film; and photovoltaic devices including the solution deposited kesterite film.

In one embodiment, a method of depositing a kesterite film comprising a compound of the formula:

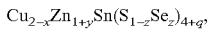
$$Cu_{2-x}Zn_{1+y}Sn(S_{1-z}Se_z)_{4+q},$$

wherein $0 \leq x \leq 1$; $0 \leq y \leq 1$; $0 \leq z \leq 1$; $-1 \leq q \leq 1$, said method comprising contacting a hydrazine-based solvent, a source of Cu, a source of Sn, a source of Zn carboxylate, a source of at least one of S and Se, under conditions sufficient to form a solution substantially free of solid particles; applying the solution onto a substrate to form a thin layer; and annealing the thin layer at a temperature, pressure, and length of time sufficient to form the kesterite film.

In another embodiment, a method of depositing a kesterite film comprising a compound of the formula:

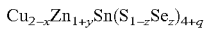
$$Cu_{2-x}Zn_{1+y}Sn(S_{1-z}Se_z)_{4+q}$$

wherein $0 \leq x \leq 1$; $0 \leq y \leq 1$; $0 \leq z \leq 1$; $-1 \leq q \leq 1$, said method comprising contacting hydrazine, a source of Cu, and a source of at least one of S and Se forming solution A; contacting hydrazine, a source of Sn, a source of at least one of S and Se, and a source of Zn forming dispersion B; mixing said solution A and said dispersion B under conditions sufficient to form a solution substantially free of particles; applying said solution onto a substrate to form a thin layer; and annealing the thin layer at a temperature, pressure, and length of time sufficient to form said kesterite film.

A hydrazine-based precursor solution for forming a kesterite film, comprises a source of Cu, a source of Sn, a source of Zn carboxylate, a source of at least one of S and Se; and hydrazine, wherein a dispersion of the Zn carboxylate in hydrazine is mixed with a solution comprising hydrazine and the source of Sn to solubilize and stabilize the source of the Zn carboxylate.

A photovoltaic device, comprising a top electrode having transparent conductive material; an n-type semiconducting layer; a kesterite film on said substrate formed by the method in claim 1; and a substrate having an electrically conductive surface.

The disadvantages associated with the prior art are overcome by the preferred embodiments of the present invention in which pure CZTS precursor solution substantially free of solid particles is employed.

The disclosure may be understood more readily by reference to the following detailed description of the various features of the disclosure and the examples included therein.

BRIEF DESCRIPTION OF THE SEVERAL VIEWS OF THE DRAWINGS

Referring now to the figures wherein the like elements are numbered alike.

DETAILED DESCRIPTION

Figure 1:
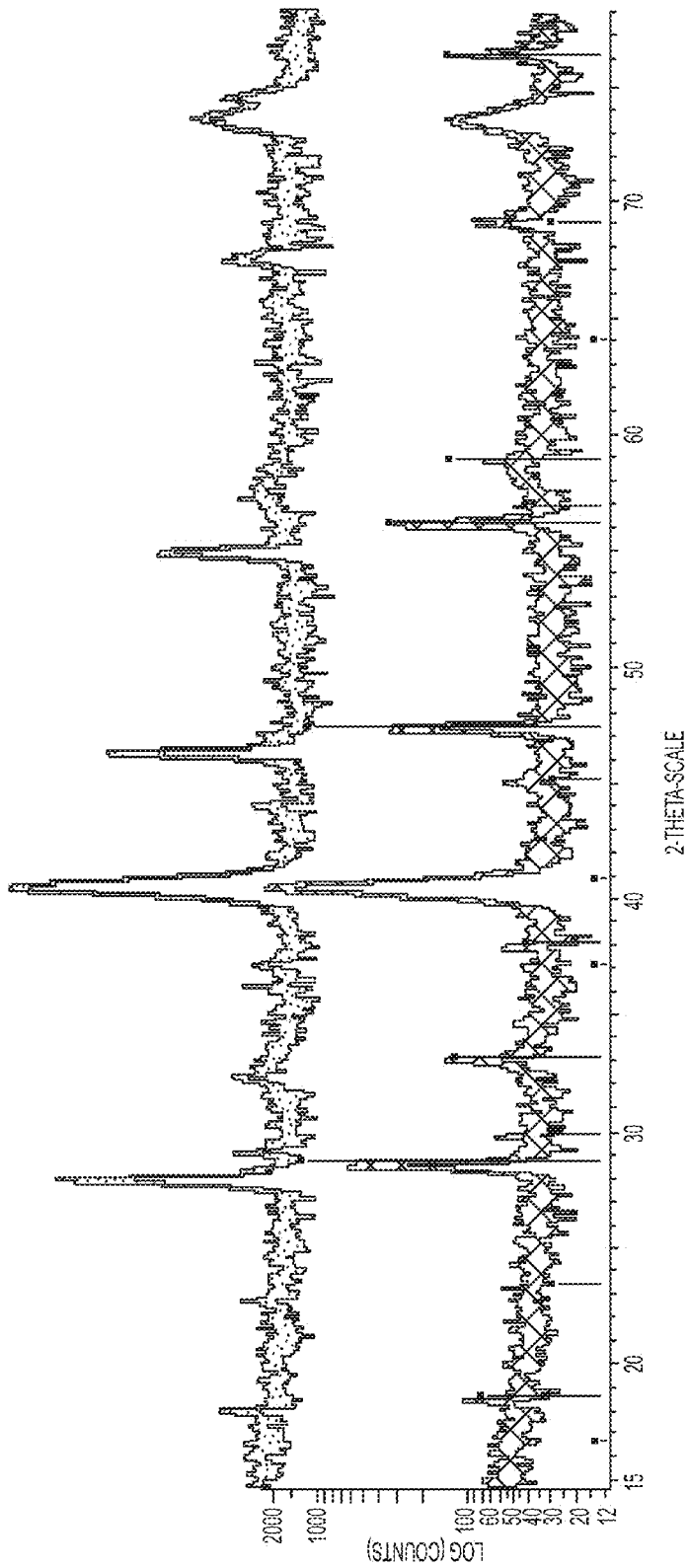
FIG. 1 is an X-ray diffraction pattern of mixed S—Se and pure sulfide kesterite materials prepared in Examples 1 and 2.

The present disclosure relates to a method of depositing a hydrazine-based copper-zinc-tin-chalcogenide kesterite film having Cu, Zn, Sn, and at least one of S and Se, and more particularly to a solution deposition method of kesterite-type Cu—Zn—Sn—(Se,S) materials to form a film and improved photovoltaic devices based on these films.

The method generally includes forming a solution including a hydrazine-based solvent, a source of Cu, a source of Sn, a source of at least one of S and Se, and a source of Zn carboxylate, wherein the solution is substantially free of solid particles; applying the solution onto a substrate to form a thin layer; and annealing at a temperature, pressure, and length of time sufficient to form the kesterite film.

The hydrazine-based solvent includes hydrazine in an amount from about 50% by weight to about 100% by weight, amounts of about weight 70% by weight to about 100% by weight in other embodiments, and about 90% by weight to about 100% by weight in still other embodiments. In addition to the hydrazine, the solvent can further include an organic or inorganic solvent. The ink solution may also include at least one additive each containing a metal selected from: Li, Na, K, Mg, Ca, Sr, Ba, Sb, Bi, and a combination thereof, wherein the metal is present in an amount from about 0.01 weight % to about 5 weight %.

The kesterite film formed by the process can be represented by formula (I):

$$Cu_{2-x}Zn_{1+y}Sn(S_{1-z}Se_z)_{4+q}, \quad (I)$$

wherein $0 \leq x \leq 1$; $0 \leq y \leq 1$; $0 \leq z \leq 1$; $-1 \leq q \leq 1$.

In one embodiment, the kesterite has the above formula wherein x, y, z and q respectively are: $0 \leq x \leq 0.5$; $0 \leq y \leq 0.5$; $0 \leq z \leq 1$; $-0.5 \leq q \leq 0.5$.

In one embodiment, the source of Cu is at least one of Cu, $Cu_2S$ and $Cu_2Se$; the source of Sn is at least one of Sn, SnSe, SnS, $SnSe_2$, $SnS_2$, Sn formate and Sn acetate; the source of Zn carboxylate is at least one of zinc acetate and zinc formate; the source of S is selected from: elemental sulfur, CuS, $Cu_2S$, SnS, $SnS_2$, ZnS, and a mixture thereof; and the source of Se is selected from at least one of elemental Se, $SnSe_2$, and SnSe.

In one embodiment, the method of depositing the hydrazine-based copper-zinc-tin-chalcogenide kesterite film includes contacting hydrazine, a source of Cu, and a source of at least one of S and Se forming solution A; contacting hydrazine, a source of Sn, a source of at least one of S and Se, and a source of Zn forming dispersion B; mixing the solution A and dispersion B under conditions sufficient to form a solution substantially free of solid particles; applying the resulting solution onto a substrate to form a thin layer; and annealing at a temperature, pressure, and length of time sufficient to form the kesterite film. While not wanting to be bound by theory, it is believed that the presence of the tin chalcogenide ions promotes stabilization of the zinc in the solution.

The step of applying in the method of the present disclosure is preferably carried out by a method selected from: spin coating, dip coating, doctor blading, curtain coating, slide coating, spraying, slit casting, meniscus coating, screen printing, ink jet printing, pad printing, flexographic printing, and gravure printing.

The substrate is selected from: metal foil, glass, ceramics, aluminum foil coated with a layer of molybdenum, a polymer, and a combination thereof. In one embodiment, the substrate is coated with a transparent conductive coating.

The step of annealing is preferably carried out at a temperature from about 200° C. to about 800° C. and ranges there between. In other embodiments, the annealing temperature is from about 400° C. to about 600° C. and in still other embodiments, the anneal temperature is from about 500 to about 600° C. The step of annealing is typically carried out in an atmosphere including: at least one of $N_2$, Ar, He, forming gas, and a mixture thereof. This atmosphere can further include vapors of at least one of sulfur, selenium, and a compound thereof. In most embodiments, the annealing step is carried out at an appropriate temperature that is high enough for thermal decomposition of the precursor but low enough to maintain the resulting film in an amorphous state. Typically, the annealing step is for an amount of time of about 1 second to about 60 minutes. More typically, the annealing step is for about 30 sec to about 20 minutes. The step of annealing can be carried our by any technique known to the skilled in the art, including but not limited to: furnace, hot plate, infrared or visible radiation, e.g., laser, lamp furnace, rapid thermal anneal unit, resistive heating of the substrate, heated gas stream, flame burner, electric arc and plasma jet.

The hydrazine-based precursor solution in accordance with the present disclosure provides greater versatility to the end user to tailor the particular stoichiometry of the kesterite film by adjusting the ratios of Cu/Sn/Zn/(S, Se) sources without the need for long range diffusion as would be expected for slurry based systems. As a result, high quality and highly pure kesterite films can be obtained.

The thickness of the applied hydrazine-based kesterite precursor layer generally ranges from about 0.2 microns to about 5 microns in most embodiments. In other embodiments, the thickness generally ranges from about 0.5 microns to about 3 microns, and in still other embodiments, the thickness ranges from about 1 microns to about 2.5 microns.

Thus, the method of the present disclosure produces a composition which includes a solution containing hydrazine solvent, a source of Cu, a source of Sn, a source of Zn carboxylate, and a source of at least one of S and Se, which when annealed, forms a compound of the formula: $Cu_{2-x}Zn_{1+y}Sn(S_{1-z}Se_z)_{4+q}$ wherein $0 \leq x \leq 1$; $0 \leq y \leq 1$; $0 \leq z \leq 1$; $-1 \leq q \leq 1$; and preferably a compound of the above formula wherein x, y, z and q respectively are: $0 \leq x \leq 0.5$; $0 \leq y \leq 0.5$; $0 \leq z \leq 1$; $-0.5 \leq q \leq 0.5$.

The present disclosure further provides a photovoltaic device, including: a substrate having an electrically conductive surface; a kesterite film on the substrate formed by the method of the present disclosure; an n-type semiconducting layer; and a top electrode having a transparent conductive material. The substrate can be glass, plastic, polymer, ceramic, or aluminum foil, and can be coated with a molybdenum layer; the n-type semiconducting layer has at least one of: ZnS, CdS, InS, oxides thereof, and selenides thereof; and the transparent conductive material can be doped ZnO, indium-tin oxide (ITO), doped tin oxide, or carbon nanotubes.

For example, photovoltaic cells may be constructed, incorporating the solution deposition methods of this disclosure, by layering the metal chalcogenide with other materials to form a two terminal, sandwich-structure device. For example, one could form a layer of $Cu_{2-x}Zn_{1+y}Sn(S_{1-z}Se_z)_{4+q}$ wherein $0 \leq x \leq 1$; $0 \leq y \leq 1$; $0 \leq z \leq 1$; $-1 \leq q \leq 1$ deposited as disclosed herein on top of a metal contact, such as molybdenum (Mo), which is supported on a rigid or flexible substrate (e.g., glass, metal, plastic). The $Cu_{2-x}Zn_{1+y}Sn(S_{1-z}Se_z)_{4+q}$ layer could then be covered with a buffer layer, which can be a metal chalcogenide such as CdS or ZnSe or an oxide such as $TiO_2$. This buffer layer could be deposited in the same fashion as the $Cu_{2-x}Zn_{1+y}Sn(S_{1-z}Se_z)_{4+q}$ layer using any of the methods of the present disclosure or it could be deposited more conventionally (e.g. by chemical bath or vapor deposition techniques). The buffer layer would then be covered with a transparent top contact such as doped $TiO_2$, indium tin oxide, or fluorine-doped tin oxide, completing the photovoltaic cell.

Alternatively, the photovoltaic cell could be constructed in the reverse order, using a transparent substrate (e.g. glass or plastic) supporting a transparent conducting contact (such as doped $TiO_2$, indium tin oxide, or fluorine-doped tin oxide). The buffer layer would then be deposited on this substrate and covered with the metal chalcogenide layer (such as $Cu_{2-x}Zn_{1+y}Sn(S_{1-z}Se_z)_{4+q}$), and finally with a back contact (such as Mo or Au). In either case, the metal chalcogenide ("absorber") layer could be deposited by the solution deposition methods described in this disclosure.

The present disclosure further provides a photovoltaic module that includes a plurality of electrically interconnected photovoltaic devices described in the present disclosure.

Experimental studies of zinc carboxylate dissolution in hydrazine indicated that slurries obtained by mixing of zinc acetate or zinc formate in hydrazine can be successfully dissolved by addition of tin-chalcogenide hydrazine solutions. The rest of the necessary precursors, such as Cu and other chalcogens can be added either to the initial tin solution or at a later stage. In contrast, the following alternative dissolution routes for zinc carboxylate lead in all cases to insoluble product: (i) mixing with pure hydrazine, (ii) mixing with chalcogen-hydrazine solutions, (iii) mixing with chalcogen-copper solutions. It is believed that the action of the tin chalcogenide hydrazinate ions provides zinc stabilization in solution. Ratios of (S,Se)/Sn from 3 to 4 were found suitable for solution formation while higher ratios promoted precipitate formations.

Pure sulfide solutions were found to be more stable than selenide solutions with identical molar composition.

Advantageously, the present disclosure provides a new approach to solubilize zinc species in hydrazine-based kesterite precursor inks. The hydrazine-based inks are substantially free of particles and provide greater versatility to tailor the stoichiometry of the kesterite film without secondary phases being present. The inks can be used in a broad range of semiconductor devices, although they are especially effective in light receiving elements such as photodiodes and photovoltaic cells.

The following examples are presented for illustrative purposes only, and are not intended to limit the scope of the invention.

EXAMPLE 1

Mixed S—Se Kesterite Solution, Film and Device Thereof

Zinc formate, 0.36 grams (g) was dispersed in 1 milliliter (ml) hydrazine (Slurry A). Tin powder, 0.25 g and Se, 0.75 g were dissolved in 3 ml hydrazine (Solution B). Copper powder, 0.226 g and sulfur, 0.175 g were dissolved in 1.5 ml hydrazine (Solution C). Solution B was added to Slurry A, followed by Solution C and 1 ml hydrazine, forming deposition ink D.

Six consecutive layers were spin coated at 600 revolutions per minute (rpm) on a molybdenum-coated glass and annealed on a covered hot plate at a maximum temperature above 540° C.

Solar cells were fabricated from the above-described $Cu_2ZnSn(Se,S)_4$ films by deposition of 60 nanometers (nm) CdS buffer layer by chemical bath deposition, 100 nm insulating ZnO and 130 nm ITO (indium-doped zinc oxide) by sputtering, followed by Ni/Al metal contacts deposited by electron-beam evaporation.

Device photovoltaic efficiency measured at 1.5 AM conditions was 6.8%, with Voc=0.404 V, Jsc=28.9 mA/$cm^2$, Fill Factor=58.2%.

Figure 2:
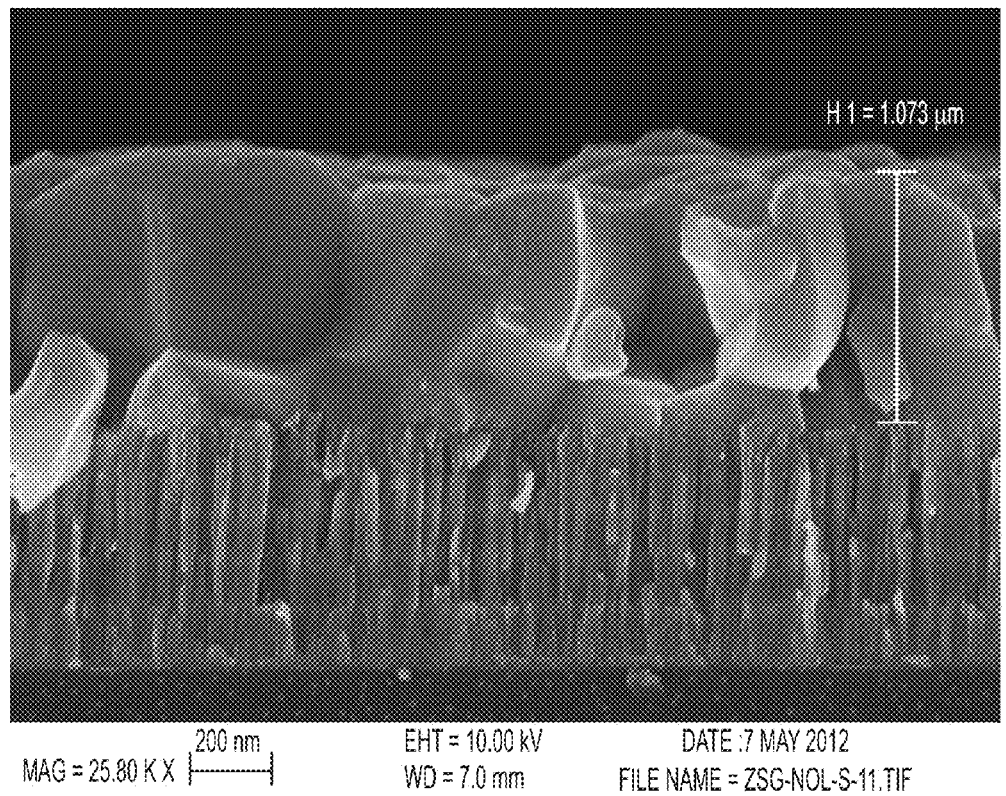
FIG. 2 is a cross-sectional scanning electron microscopy image of a film prepared according to Example 1.

FIG. 1 provides X-ray diffraction patterns of the obtained S—Se kesterite film (top). FIG. 2 provides a scanning electron micrograph of the S—Se kesterite film. Large-grain void-free layers was observed, which is generally considered desirable for photovoltaic devices.

EXAMPLE 2

Pure S-Kesterite Solution, and Film Thereof

Zinc formate, 0.37 g was dispersed in 1 ml hydrazine (Slurry E). Tin powder, 0.26 g and S, 0.312 g were dissolved in 3 ml hydrazine (Solution F). Copper powder, 0.226 g and sulfur, 0.175 g were dissolved in 1.5 ml hydrazine (Solution G). Solution F was added to Solution E, followed by Solution G and 1 ml hydrazine, forming deposition ink H.

Six consecutive layers were spin coated at 600 rpm on a molybdenum-coated glass and annealed on a covered hot plate at a maximum temperature above 540° C.

Figure 3:
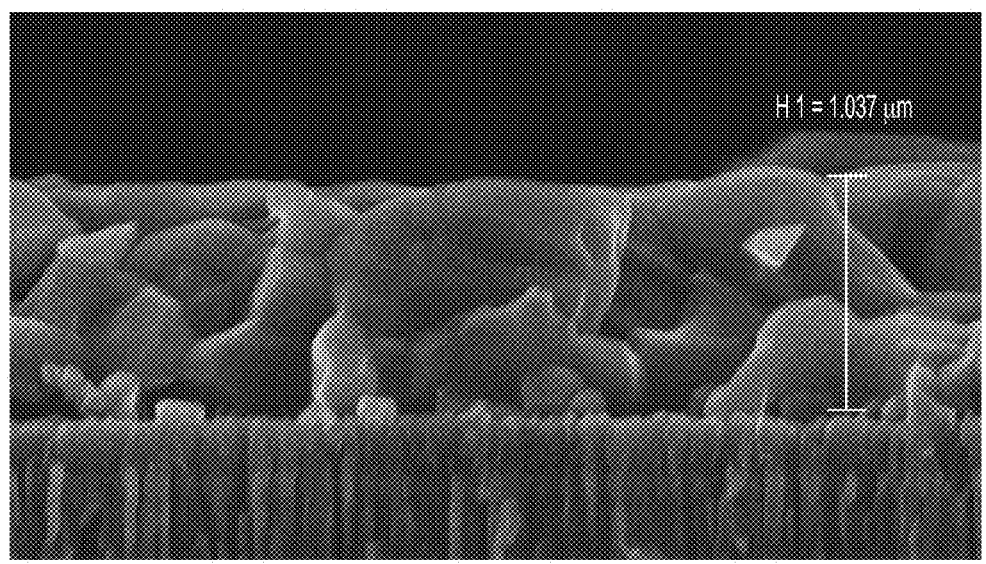
FIG. 3 is a cross-sectional scanning electron microscopy image of a film prepared according to Example 2.

FIG. 1 provides X-ray diffraction patterns of the obtained pure sulfide kesterite film (bottom). FIG. 3 provides a scanning electron micrograph of the pure sulfide kesterite film. Large-grain void-free layers was observed, which is generally considered desirable for photovoltaic devices.

EXAMPLE 3

Improved S—Se Kesterite Solutions, Film and Device Thereof

Zinc formate, 0.735 g was dispersed in 1.5 ml hydrazine (Slurry I). Tin powder, 0.52 g and Se, 1.21 g were dissolved in 5 ml hydrazine (Solution J). Copper powder, 0.436 g and sulfur, 0.33 g were dissolved in 3 ml hydrazine (Solution K). Solution J was added to Solution K followed by 1 ml of hydrazine used to wash vial J resulting in solution L. Solution L was added to slurry I followed by 1 ml of hydrazine used to wash vial L, forming deposition ink M. One (1) ml of ink M was added to 0.1 ml HZ containing 0.07 g Se forming deposition ink N.

On a molybdenum-coated glass, one layer of ink M was spun at 800 rpm followed by six layers spun at 600 rpm and one layer of ink N spun at 500 rpm and annealed on a covered hot plate at a maximum temperature above 540 C.

Solar cells were fabricated from the above-described $Cu_2ZnSn(Se,S)_4$ films by deposition of 60 nm CdS buffer layer by chemical bath deposition, 100 nm insulating ZnO and 130 nm ITO (indium-doped zinc oxide) by sputtering, followed by Ni/Al metal contacts deposited by electron-beam evaporation.

Device photovoltaic efficiency measured at 1.5 AM conditions was 10.4%, with Voc=0.478 V, Jsc=33.8 mA/$cm^2$, Fill Factor=64.4%.

Figure 4:
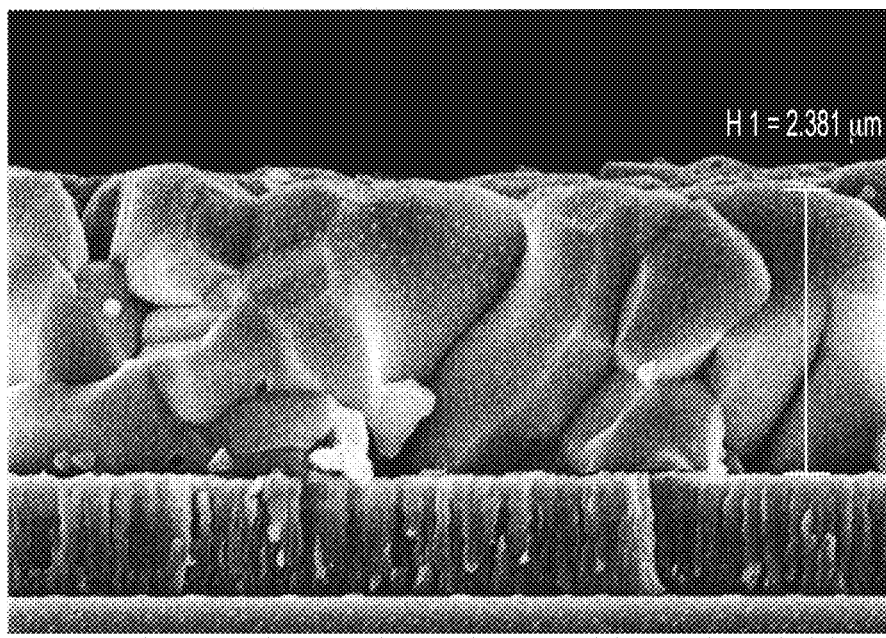
FIG. 4 is a cross-sectional scanning electron microscopy image of a film prepared according to Example 3.

FIG. 4 provides a scanning electron micrograph of the S—Se kesterite film. Large-grain void-free layers was observed, which is generally considered desirable for photovoltaic devices.

FILM CHARACTERIZATION

X-ray diffraction patterns of the obtained films matched kesterite phase (FIG. 1). SEM images indicate large-grain void-free layers desirable for photovoltaic devices (FIGS. 2, 3).

The present invention has been described with particular reference to the preferred embodiments. It should be understood that variations and modifications thereof can be devised by those skilled in the art without departing from the spirit and scope of the present invention. Accordingly, the present invention embraces all such alternatives, modifications and variations that fall within the scope of the appended claims.

What is claimed is:

1. A method of depositing a kesterite film comprising a compound of the formula:

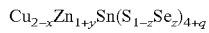

wherein 0≤x≤1; 0≤y≤1; 0≤z≤1; −1≤q≤1,
said method comprising:
contacting a hydrazine-based solvent, a source of Cu selected from the group consisting of Cu, $Cu_2S$ and $Cu_2Se$, a source of Sn selected from the group consisting of Sn, SnS, $SnS_2$, SnSe, and $SnSe_2$, a source of Zn carboxylate, a source of at least one of S and Se, under conditions sufficient to form a solution free of solid particles, wherein the conditions consist of dispersing the source of the zinc carboxylate in a portion of the hydrazine-based solvent to form a first slurry of zinc carboxylate particles, and dispersing the source of Sn in a portion of the hydrazine-based solvent to form an initial Sn solution, and mixing the first slurry and the initial Sn solution to dissolve the zinc carboxylate particles and form the solution free of solid particles, wherein the source of Cu, and the source of at least one of S and Se are added to the initial Sn solution or to the solution free of solid particles;
applying the solution free of solid particles onto a substrate to form a thin layer having a thickness of about 0.2 microns to about 5 microns; and
annealing the thin layer at a temperature, pressure, and length of time sufficient to form the kesterite film.

2. The method of claim 1, wherein said hydrazine-based solvent comprises hydrazine in an amount from about 1 weight % to about 99 weight % by total weight of the solvent.

3. The method of claim 1, wherein said source of Zn carboxylate is at least one of zinc formate and zinc acetate.

4. The method of claim 1, wherein said source of S or Se is at least one of S and Se.

5. The method of claim 1, wherein said solution substantially free of particles further comprises at least one additive each containing a metal selected from the group consisting of: Li, Na, K, Mg, Ca, Sr, Ba, Sb, Bi, and a combination thereof.

6. The method of claim 5, wherein said metal is present in an amount from about 0.01 weight % to about 5 weight % by total weight of the solution substantially free of particles.

7. The method of claim 1, wherein said hydrazine-based solvent further comprises an organic solvent from about 1 weight % to about 99 weight % by total weight of the solvent.

8. The method of claim 1, wherein said hydrazine-based solvent further comprises an inorganic solvent different from hydrazine from about 1 weight % to about 99 weight % by total weight of the solvent.

9. The method of claim 1, wherein x, y, z and q respectively are: 0≤x≤0.5; 0≤y≤0.5; 0≤z≤1; −0.5≤q≤0.5.

10. The method of claim 1, wherein said substrate is selected from the group consisting of: metal foil, glass, ceramics, aluminum foil coated with a layer of molybdenum, a polymer, and a combination thereof.

11. The method of claim 1, wherein said substrate is coated with a transparent conductive coating.

12. The method of claim 1, wherein the applying the solution substantially free of solid particles is carried out by a method selected from the group consisting of: spin coating, dip coating, doctor blading, curtain coating, slide coating, spraying, slit casting, meniscus coating, screen printing, ink jet printing, pad printing, flexographic printing, and gravure printing.

13. The method of claim 1, wherein the annealing is carried out at a temperature from about 200° C. to about 800° C. and ranges there between.

14. The method of claim 1, wherein the annealing is carried out in an atmosphere comprising: at least one of: $N_2$, Ar, He, forming gas, and a mixture thereof.

* * * * *